(12) United States Patent
McHugh

(10) Patent No.: US 12,413,196 B2
(45) Date of Patent: Sep. 9, 2025

(54) TUNING ACOUSTIC RESONATORS WITH BACK-SIDE COATING

(71) Applicant: Murata Manufacturing Co., Ltd., Nagaokakyo (JP)

(72) Inventor: Sean McHugh, Santa Barbara, CA (US)

(73) Assignee: Murata Manufacturing Co., Ltd., Nagaokakyo (JP)

(*) Notice: Subject to any disclaimer, the term of this patent is extended or adjusted under 35 U.S.C. 154(b) by 182 days.

(21) Appl. No.: 18/169,251

(22) Filed: Feb. 15, 2023

(65) Prior Publication Data

US 2023/0261626 A1    Aug. 17, 2023

Related U.S. Application Data

(60) Provisional application No. 63/311,010, filed on Feb. 16, 2022.

(51) Int. Cl.
  *H03H 3/04* (2006.01)
  *H03H 3/02* (2006.01)
  (Continued)

(52) U.S. Cl.
  CPC .......... *H03H 3/04* (2013.01); *H03H 9/02228* (2013.01); *H03H 9/174* (2013.01);
  (Continued)

(58) Field of Classification Search
  CPC ...... H03H 3/04; H03H 9/02228; H03H 9/174; H03H 9/176; H03H 9/562; H03H 9/564;
  (Continued)

(56) References Cited

U.S. PATENT DOCUMENTS

| 5,705,399 A | 1/1998 | Larue |
| 5,853,601 A | 12/1998 | Krishaswamy et al. |

(Continued)

FOREIGN PATENT DOCUMENTS

| CN | 1926763 A | 3/2007 |
| CN | 201893487 U | 7/2011 |

(Continued)

OTHER PUBLICATIONS

T. Takai, H. Iwamoto, et al., I.H.P. Saw Technology and its Application to Microacoustic Components (Invited). 2017 IEEE International Ultrasonics Symposium, Sep. 6-9, 2017. pp. 1-8.

(Continued)

*Primary Examiner* — Jorge L Salazar, Jr.
(74) *Attorney, Agent, or Firm* — ArentFox Schiff LLP

(57) ABSTRACT

A filter device is provided that includes a substrate and a piezoelectric plate attached to the substrate. A conductor pattern is formed at a first surface of the piezoelectric plate and includes interdigital transducers of series and shunt resonators that each have interleaved fingers at respective diaphragms of the plate suspended. A first dielectric coating layer is formed over the interleaved fingers of the IDTs and on the first surface of the piezoelectric plate; and a second dielectric coating layer is formed on the second surface of the piezoelectric plate that is opposite the first surface. The second dielectric coating layer of the shunt resonator has a greater thickness than a thickness of the at least one second dielectric coating layer of the series resonator.

20 Claims, 10 Drawing Sheets

(51) Int. Cl.
*H03H 9/02* (2006.01)
*H03H 9/17* (2006.01)
*H03H 9/56* (2006.01)

(52) U.S. Cl.
CPC ............ *H03H 9/176* (2013.01); *H03H 9/562* (2013.01); *H03H 9/564* (2013.01); *H03H 9/568* (2013.01); *H03H 2003/023* (2013.01); *H03H 2003/0442* (2013.01)

(58) Field of Classification Search
CPC ............. H03H 9/568; H03H 2003/023; H03H 2003/0442; H03H 3/02; H03H 9/02015; H03H 9/02062
USPC .......................... 333/133, 187, 188, 193–196
See application file for complete search history.

(56) References Cited

U.S. PATENT DOCUMENTS

| | | |
|---|---|---|
| 6,540,827 B1 | 4/2003 | Levy et al. |
| 6,707,229 B1 | 3/2004 | Martin |
| 7,135,940 B2 | 11/2006 | Kawakubo et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,802,466 B2 | 9/2010 | Whalen et al. |
| 7,868,519 B2 | 1/2011 | Umeda |
| 8,278,802 B1 | 10/2012 | Lee et al. |
| 8,344,815 B2 | 1/2013 | Yamanaka |
| 8,829,766 B2 | 9/2014 | Milyutin et al. |
| 8,932,686 B2 | 1/2015 | Hayakawa et al. |
| 9,130,145 B2 | 9/2015 | Martin et al. |
| 9,219,466 B2 | 12/2015 | Meltaus et al. |
| 9,276,557 B1 | 3/2016 | Nordquist et al. |
| 9,281,800 B2 | 3/2016 | Tsuzuki |
| 9,369,105 B1 | 6/2016 | Li |
| 9,425,765 B2 | 8/2016 | Rinaldi |
| 9,525,398 B1 | 12/2016 | Olsson |
| 9,748,923 B2 | 8/2017 | Kando et al. |
| 9,780,759 B2 | 10/2017 | Kimura et al. |
| 10,200,013 B2 | 2/2019 | Bower et al. |
| 10,284,176 B1 * | 5/2019 | Solal ..................... B06B 1/0622 |
| 10,305,447 B2 | 5/2019 | Raihn et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,756,697 B2 | 8/2020 | Plesski et al. |
| 10,790,802 B2 | 9/2020 | Yantchev et al. |
| 10,797,675 B2 | 10/2020 | Plesski |
| 10,826,462 B2 | 11/2020 | Plesski et al. |
| 10,868,513 B2 | 12/2020 | Yantchev |
| 2002/0079986 A1 | 6/2002 | Ruby et al. |
| 2002/0158714 A1 | 10/2002 | Kaitila et al. |
| 2003/0199105 A1 | 10/2003 | Kub et al. |
| 2004/0041496 A1 | 3/2004 | Imai et al. |
| 2004/0090145 A1 | 5/2004 | Bauer et al. |
| 2004/0207033 A1 | 10/2004 | Koshido |
| 2004/0207485 A1 | 10/2004 | Kawachi et al. |
| 2004/0261250 A1 | 12/2004 | Kadota et al. |
| 2005/0280476 A1 | 12/2005 | Abe et al. |
| 2006/0072875 A1 | 4/2006 | Bhagavatula et al. |
| 2006/0125489 A1 | 6/2006 | Feucht et al. |
| 2006/0131731 A1 | 6/2006 | Sato |
| 2006/0152107 A1 | 7/2006 | Tanaka |
| 2006/0222568 A1 | 10/2006 | Wang et al. |
| 2007/0001549 A1 | 1/2007 | Kando et al. |
| 2007/0090898 A1 | 4/2007 | Kando |
| 2007/0170565 A1 | 7/2007 | Hong et al. |
| 2007/0188047 A1 | 8/2007 | Tanaka |
| 2007/0194863 A1 | 8/2007 | Shibata et al. |
| 2010/0064492 A1 | 3/2010 | Tanaka |
| 2010/0102669 A1 | 4/2010 | Yamanaka |
| 2010/0107388 A1 | 5/2010 | Iwamoto |
| 2010/0123367 A1 | 5/2010 | Tai et al. |
| 2010/0212127 A1 | 8/2010 | Heinze et al. |
| 2010/0223999 A1 | 9/2010 | Onoe |
| 2010/0301703 A1 | 12/2010 | Chen et al. |
| 2011/0109196 A1 | 5/2011 | Goto |
| 2011/0199163 A1 | 8/2011 | Yamanaka |
| 2011/0278993 A1 | 11/2011 | Iwamoto |
| 2013/0015353 A1 | 1/2013 | Tai et al. |
| 2013/0021116 A1 | 1/2013 | Sogoya et al. |
| 2013/0057360 A1 | 3/2013 | Meltaus et al. |
| 2013/0321100 A1 | 12/2013 | Wang |
| 2014/0001919 A1 | 1/2014 | Komatsu |
| 2014/0009032 A1 | 1/2014 | Takahashi et al. |
| 2014/0113571 A1 | 4/2014 | Fujiwara |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0218129 A1 | 8/2014 | Fujiwara |
| 2014/0225684 A1 | 8/2014 | Kando et al. |
| 2014/0312994 A1 | 10/2014 | Meltaus et al. |
| 2015/0070227 A1 | 3/2015 | Kishino et al. |
| 2015/0319537 A1 | 11/2015 | Perois et al. |
| 2015/0333730 A1 | 11/2015 | Meltaus |
| 2016/0028367 A1 | 1/2016 | Shealy |
| 2016/0049920 A1 | 2/2016 | Kishino |
| 2016/0182009 A1 | 6/2016 | Bhattacharjee |
| 2016/0285430 A1 | 9/2016 | Kikuchi et al. |
| 2017/0005638 A1 | 1/2017 | Otagawa et al. |
| 2017/0063332 A1 | 3/2017 | Gilbert et al. |
| 2017/0077902 A1 | 3/2017 | Daimon |
| 2017/0104470 A1 | 4/2017 | Koelle et al. |
| 2017/0170808 A1 | 6/2017 | Iwaki et al. |
| 2017/0179928 A1 | 6/2017 | Raihn et al. |
| 2017/0187352 A1 | 6/2017 | Omura |
| 2017/0214387 A1 | 7/2017 | Burak et al. |
| 2017/0222618 A1 | 8/2017 | Inoue et al. |
| 2017/0222622 A1 | 8/2017 | Solal et al. |
| 2017/0264263 A1 | 9/2017 | Huang et al. |
| 2017/0324394 A1 | 11/2017 | Ebner et al. |
| 2017/0359050 A1 | 12/2017 | Irieda et al. |
| 2017/0370791 A1 | 12/2017 | Nakamura et al. |
| 2018/0062604 A1 | 3/2018 | Koskela et al. |
| 2018/0123016 A1 | 5/2018 | Gong et al. |
| 2018/0152169 A1 | 5/2018 | Goto et al. |
| 2018/0191322 A1 | 7/2018 | Chang et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0148621 A1 | 5/2019 | Feldman et al. |
| 2019/0181833 A1 | 6/2019 | Nosaka |
| 2019/0245518 A1 | 8/2019 | Ito |
| 2019/0273480 A1 | 9/2019 | Lin |
| 2019/0273481 A1 | 9/2019 | Michigami |
| 2019/0386635 A1 | 12/2019 | Plesski et al. |
| 2019/0386637 A1 | 12/2019 | Plesski et al. |
| 2019/0386638 A1 | 12/2019 | Kimura et al. |
| 2020/0007110 A1 | 1/2020 | Konaka et al. |
| 2020/0021271 A1 | 1/2020 | Plesski et al. |
| 2020/0091893 A1 | 3/2020 | Plesski et al. |
| 2020/0162052 A1 | 5/2020 | Matsuoka et al. |
| 2020/0220522 A1 | 7/2020 | Nosaka |
| 2020/0228087 A1 | 7/2020 | Michigami et al. |
| 2020/0304091 A1 | 9/2020 | Yantchev |
| 2020/0328728 A1 | 10/2020 | Nakagawa et al. |
| 2020/0336130 A1 | 10/2020 | Turner |
| 2020/0373907 A1 | 11/2020 | Garcia |
| 2021/0005805 A1 | 1/2021 | Shibata et al. |
| 2021/0006228 A1 | 1/2021 | Garcia |
| 2021/0013859 A1 | 1/2021 | Turner et al. |
| 2021/0013868 A1 | 1/2021 | Plesski |
| 2021/0126619 A1 | 4/2021 | Wang et al. |
| 2021/0273631 A1 | 9/2021 | Jachowski et al. |
| 2021/0384885 A1 | 12/2021 | Daimon et al. |
| 2022/0103160 A1 | 3/2022 | Jachowski |
| 2022/0216842 A1 | 7/2022 | Nagatomo et al. |
| 2022/0216846 A1 | 7/2022 | Yamane et al. |
| 2022/0231661 A1 | 7/2022 | McHugh |

(56) References Cited

U.S. PATENT DOCUMENTS

FOREIGN PATENT DOCUMENTS

| | | |
|---|---|---|
| CN | 112352382 A | 2/2021 |
| DE | 112011100580 T5 | 1/2013 |
| JP | H0522074 A | 1/1993 |
| JP | H10209804 A | 8/1998 |
| JP | 2001244785 A | 9/2001 |
| JP | 2002300003 A | 10/2002 |
| JP | 2003078389 A | 3/2003 |
| JP | 2004096677 A | 3/2004 |
| JP | 2004129222 A | 4/2004 |
| JP | 2004304622 A | 10/2004 |
| JP | 2006173557 A | 6/2006 |
| JP | 2007251910 A | 9/2007 |
| JP | 2010103803 A | 5/2010 |
| JP | 2010109949 A | 5/2010 |
| JP | 2010233210 A | 10/2010 |
| JP | 2013528996 A | 7/2013 |
| JP | 2015054986 A | 3/2015 |
| JP | 2016001923 A | 1/2016 |
| JP | 2017220910 A | 12/2017 |
| JP | 2018166259 A | 10/2018 |
| JP | 2018207144 A | 12/2018 |
| JP | 2019186655 A | 10/2019 |
| JP | 2020088459 A | 6/2020 |
| JP | 2020113939 A | 7/2020 |
| WO | 2010047114 A1 | 4/2010 |
| WO | 2013021948 A1 | 2/2013 |
| WO | 2015098694 A1 | 7/2015 |
| WO | 2015156232 A1 | 10/2015 |
| WO | 2015182521 A1 | 12/2015 |
| WO | 2016017104 A1 | 2/2016 |
| WO | 2016052129 A1 | 4/2016 |
| WO | 2016147687 A1 | 9/2016 |
| WO | 2018003273 A1 | 1/2018 |
| WO | 2018079522 A1 | 5/2018 |
| WO | 2018163860 A1 | 9/2018 |
| WO | 2019138810 A1 | 7/2019 |
| WO | 2019241174 A1 | 12/2019 |
| WO | 2020092414 A2 | 5/2020 |
| WO | 2020175234 A1 | 9/2020 |
| WO | 2021060512 A1 | 4/2021 |
| WO | 2021060523 A1 | 4/2021 |
| WO | 2022/220155 A1 | 10/2022 |
| WO | 2022/244746 A1 | 11/2022 |
| WO | 2023002858 A1 | 1/2023 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 Ghz Lithium Niobate Mems Resonators With High Fom of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary "Meaning of diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

"Acoustic Properties of Solids" ONDA Corporation, 592 Weddell Drive, Sunnyvale, CA 94089, Apr. 11, 2003, pp. 5 (Year 2003).

Bahreynl, B., "Fabrication and Design of Resonant Microdevices" Andrew William, Inc. 2018, NY (Year 2008).

Material Properties of Tibtech Innovations, © 2018 TIBTECH Innovations (Year 2018).

Bousquet, Marie e al. "Single-mode high frequency LiNbO3 Film Bulk Acoustic Resonator," 2019 IEEE International Ultrasonics Symposium (IUS), Glasgow, Scotland, Oct. 6-9, 2019, pp. 84-87.

Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).

Yantchev, Ventsislav & Katardjiev, Ilia. (2013). Thin film Lamb wave resonators in frequency control and sensing applications: A review. Journal of Micromechanics and Microengineering. 23. 043001. 10.1088/0960-1317/23/4/043001.

Wei Pang et al. "Analytical and experimental study on the second harmonic mode response of a bulk acoustic wave resonator" 2010 J. Micromech. Microeng. 20 115015; doi: 10.1088/0960-1317/20/11/115015.

Durmus et al. "Acoustic-Based Biosensors" Encyclopedia of Microfluidics and Nanofluidics. DOI 10.1007/978-3-642-27758-0_10-2 Springer Science+Business Media New York 2014.

USPTO/ISA, International Search Report and Written Opinion for PCT Application No. PCT/US2023/017732 dated Jul. 27, 2023.

USPTO/ISA, International Search Report and Written Opinion for PCT Application No. PCT/US2022/082421 dated May 3, 2023.

USPTO/ISA, International Search Report and Written Opinion for PCT Application No. PCT/US2022/081095 dated May 30, 2023.

USPTO/ISA, International Search Report and Written Opinion for PCT Application No. PCT/US2022/079236 dated Mar. 10, 2023.

USPTO/ISA, International Search Report and Written Opinion for PCT Application No. PCT/US2022/081068 dated Apr. 18, 2023.

USPTO/ISA, International Search Report and Written Opinion for PCT Application No. PCT/US2022/080246 dated Mar. 30, 2023.

Gong et al., "Design and Analysis of Lithium-Niobate-Based High Electromechanical Coupling RF-MEMS Resonators for Wideband Filtering", IEEE Transactions on Microwave Theory and Techniques, vol. 61, No. 1, Jan. 2013, pp. 403-413.

* cited by examiner

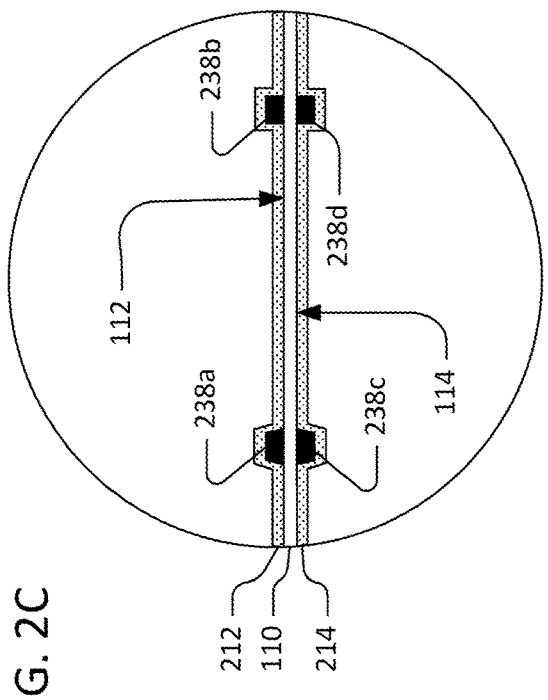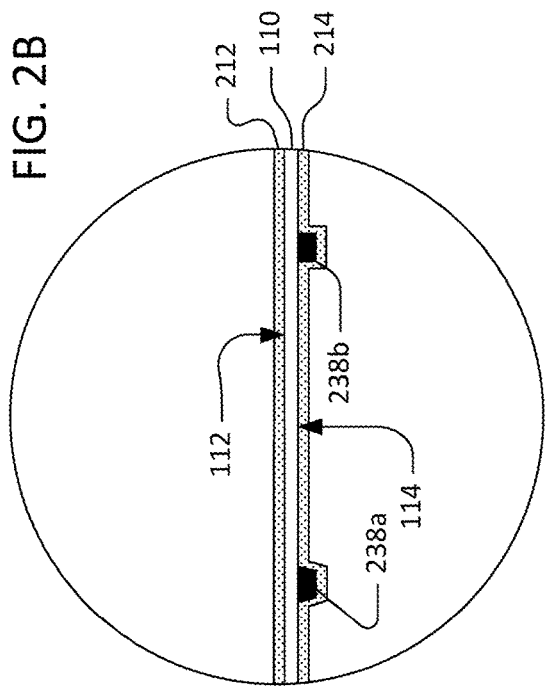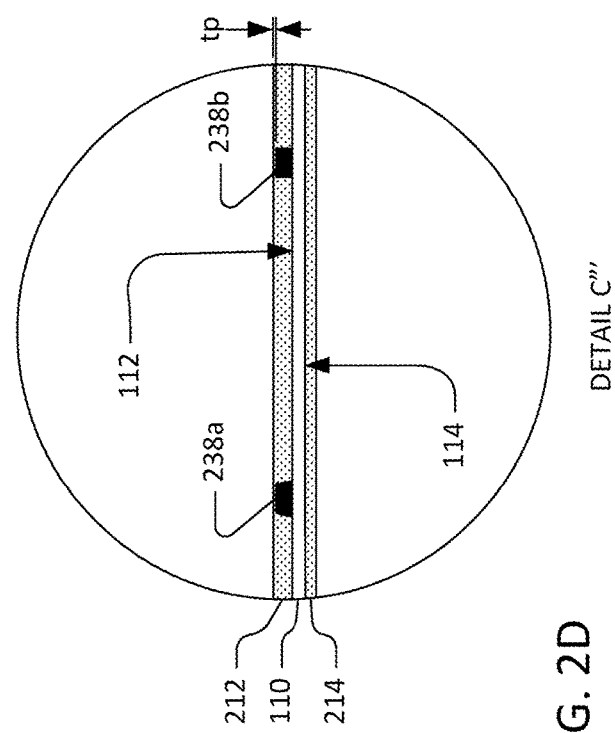

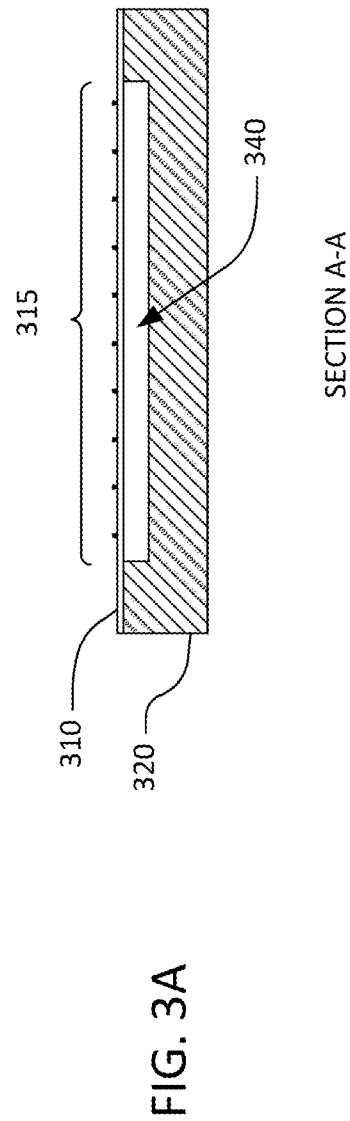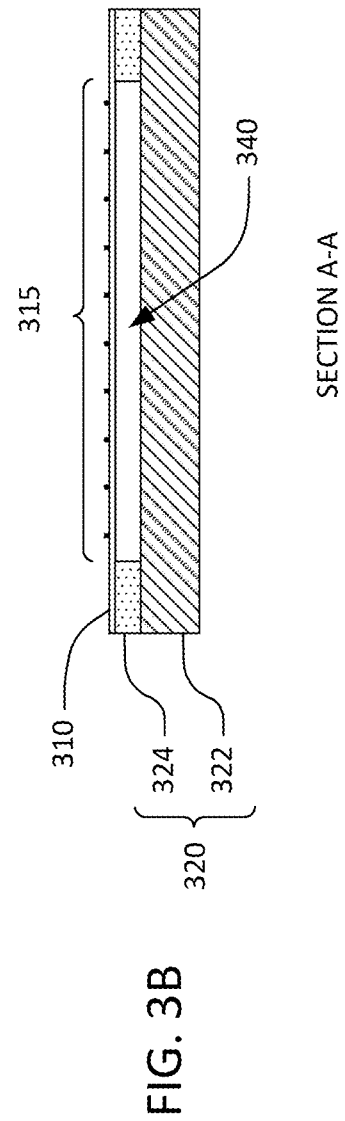
FIG. 3A
FIG. 3B

TUNING ACOUSTIC RESONATORS WITH BACK-SIDE COATING

CROSS REFERENCE TO RELATED APPLICATIONS

The current application claims priority to U.S. Patent Provisional Application No. 63/311,010, filed Feb. 16, 2022, the entire contents of which are hereby incorporated by reference.

TECHNICAL FIELD

This disclosure relates to radio frequency filters using acoustic wave resonators, and specifically to filters for use in communications equipment.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band may depend on the specific application. For example, in some cases a "pass-band" may be defined as a frequency range where the insertion loss of a filter is better than a defined value such as 1 dB, 2 dB, or 3 dB, while a "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

SUMMARY

Thus, according to an exemplary aspect, a filter device is provided that includes a substrate; at least one piezoelectric plate having opposing first and second surfaces and attached to the substrate; a conductor pattern at a first surface of the at least one piezoelectric plate and including a plurality of interdigital transducers (IDTs) of a plurality of resonators, respectively, that each have interleaved fingers at respective diaphragms of the at least one piezoelectric plate suspended over one or more cavities, with the plurality of resonators including a shunt resonator and a series resonator; at least one first dielectric coating layer over at least the interleaved fingers of the IDTs and on the first surface of the at least one piezoelectric plate; and at least one second dielectric coating layer on the second surface of the at least one piezoelectric plate that is opposite the first surface. In this aspect, the at least one second dielectric coating layer of the shunt resonator has a greater thickness than a thickness of the at least one second dielectric coating layer of the series resonator.

Moreover, in an exemplary aspect, the thickness of the at least one second dielectric coating layer of the shunt resonator is configured such that the shunt resonator has a resonance frequency with an anti-resonance (e.g., when impedance is very high) that is approximately at a same frequency as the resonance frequency of the series resonator. Yet further, the thickness of the at least one second dielectric coating layer of the shunt resonator can be approximately ten times the thickness of the at least one second dielectric coating layer of the series resonator. In addition, a thickness of the second dielectric coating layer is greater than a thickness of the first dielectric coating layer. Moreover, the at least one second dielectric coating layer is uniform with opposing surfaces that are parallel to the second surface of the at least one piezoelectric plate.

In another exemplary aspect, an acoustic resonator device is provided that includes a substrate having a surface; a piezoelectric plate attached to the surface of the substrate except for a portion of the piezoelectric plate that forms a diaphragm that spans a cavity; an interdigital transducer (IDT) at a first surface of the piezoelectric plate and having interleaved fingers at the diaphragm; a first dielectric coating layer over at least the interleaved fingers of the IDT and on a first surface of the piezoelectric plate; and a second dielectric coating layer on a second surface of the piezoelectric plate that is opposite the first surface. Moreover, a thickness of the second dielectric coating layer is greater than a thickness of the first dielectric coating layer. In addition, the second dielectric coating layer is uniform with opposing surfaces that are parallel to the second surface of the piezoelectric plate that configures a resonance frequency of the acoustic resonator device.

In yet another exemplary aspect, a method for manufacturing a filter device is provided. In this aspect, the method includes attaching at least one piezoelectric plate having opposing first and second surfaces to a substrate; forming a conductor pattern at a first surface of the at least one piezoelectric plate that includes a plurality of interdigital transducers (IDTs) of a plurality of resonators, respectively, that each have interleaved fingers at respective diaphragms of the at least one piezoelectric plate suspended over one or more cavities, with the plurality of resonators including a shunt resonator and a series resonator; depositing at least one first dielectric coating layer over at least the interleaved fingers of the IDTs and on the first surface of the piezoelectric plate; depositing at least one second dielectric coating layer on the second surface of the piezoelectric plate that is opposite the first surface; and trimming the at least one second dielectric coating layer to adjust a resonance frequency of at least one of the shunt resonator and the series resonator.

The above simplified summary of example aspects serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows.

BRIEF DESCRIPTION OF THE DRAWINGS

The accompanying drawings, which are incorporated into and constitute a part of this specification, illustrate one or more example aspects of the present disclosure and, together with the detailed description, serve to explain their principles and implementations.

FIG. 2B is an expanded schematic cross-sectional view of an alternative configuration of the XBAR of FIG. 1.

FIG. 2C is an expanded schematic cross-sectional view of another alternative configuration of the XBAR of FIG. 1.

FIG. 2D is an expanded schematic cross-sectional view of another alternative configuration of the XBAR of FIG. 1.

FIG. 3A is an alternative schematic cross-sectional view of the XBAR of FIG. 1.

FIG. 3B is an alternative schematic cross-sectional view of the XBAR of FIG. 1.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Figure 1:
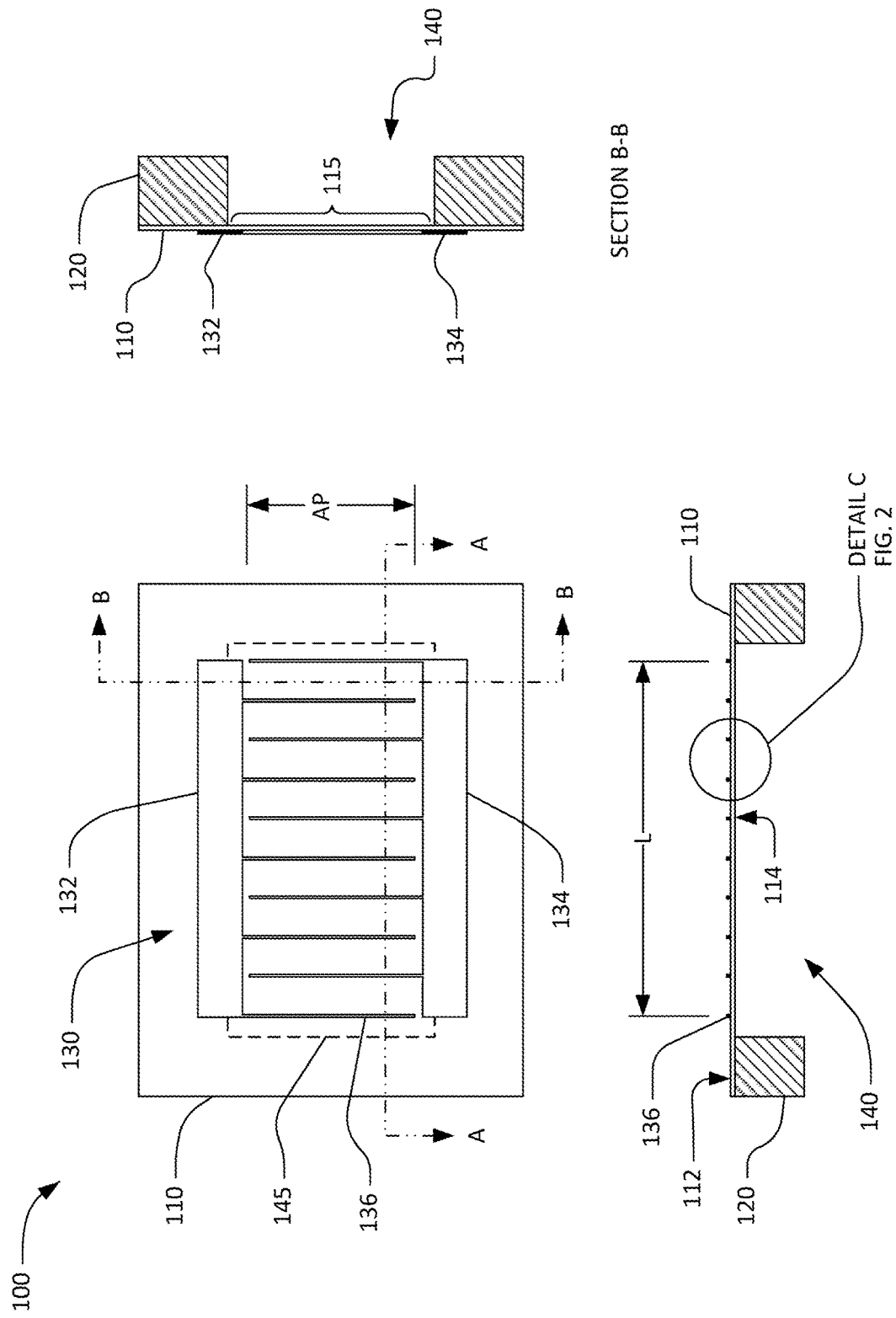
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

In general, the XBAR 100 is made up of a thin film conductor pattern formed at one or both surfaces of a piezoelectric plate 110 having parallel front and back surfaces 112, 114, respectively (also referred to generally first and second surfaces, respectively). The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples described herein, the piezoelectric plates are Z-cut, which is to say the Z axis is normal to the front and back surfaces 112, 114. However, XBARs may be fabricated on piezoelectric plates with other crystallographic orientations including rotated Z-cut and rotated YX cut.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans (e.g., extends over) the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". However, in some cases, the diaphragm 115 is not necessarily contiguous.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner.

"Cavity" has its conventional meaning of "an empty space within a solid body." The cavity 140 may be a hole completely through the substrate 120 (as shown in Section A-A and Section B-B) or a recess in the substrate 120 (as shown subsequently in FIG. 3A and FIG. 3B). The substrate 120 may be made of a monolithic material, may be made up of multiple materials, a composite of materials, and any combination thereof. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

In the examples of FIG. 1, FIG. 3A. and FIG. 3B, the IDT 130 is on the front surface 112 (e.g., the first surface) of the piezoelectric plate 110. In other configurations, the IDT 130 may be on the back surface 114 (e.g., the second surface) of the piezoelectric plate 110 or on both the front and back surfaces 112, 114.

The first and second busbars 132, 134 are configured as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned at or on the piezoelectric plate 110 such that at least the fingers of the IDT 130 are extend at or on the diaphragm 115 of the piezoelectric plate that spans, or is suspended over, the cavity 140. As shown in FIG. 1, the cavity 140 has a rectangular cross section with an extent greater than the aperture AP and length L of the IDT 130. According to other exemplary aspects, the cavity of an XBAR may have a different cross-sectional shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT. An XBAR may have hundreds, possibly thousands, of parallel fingers in the IDT. Similarly, the thickness of the fingers in the cross-sectional views is greatly exaggerated.

Figure 2A:
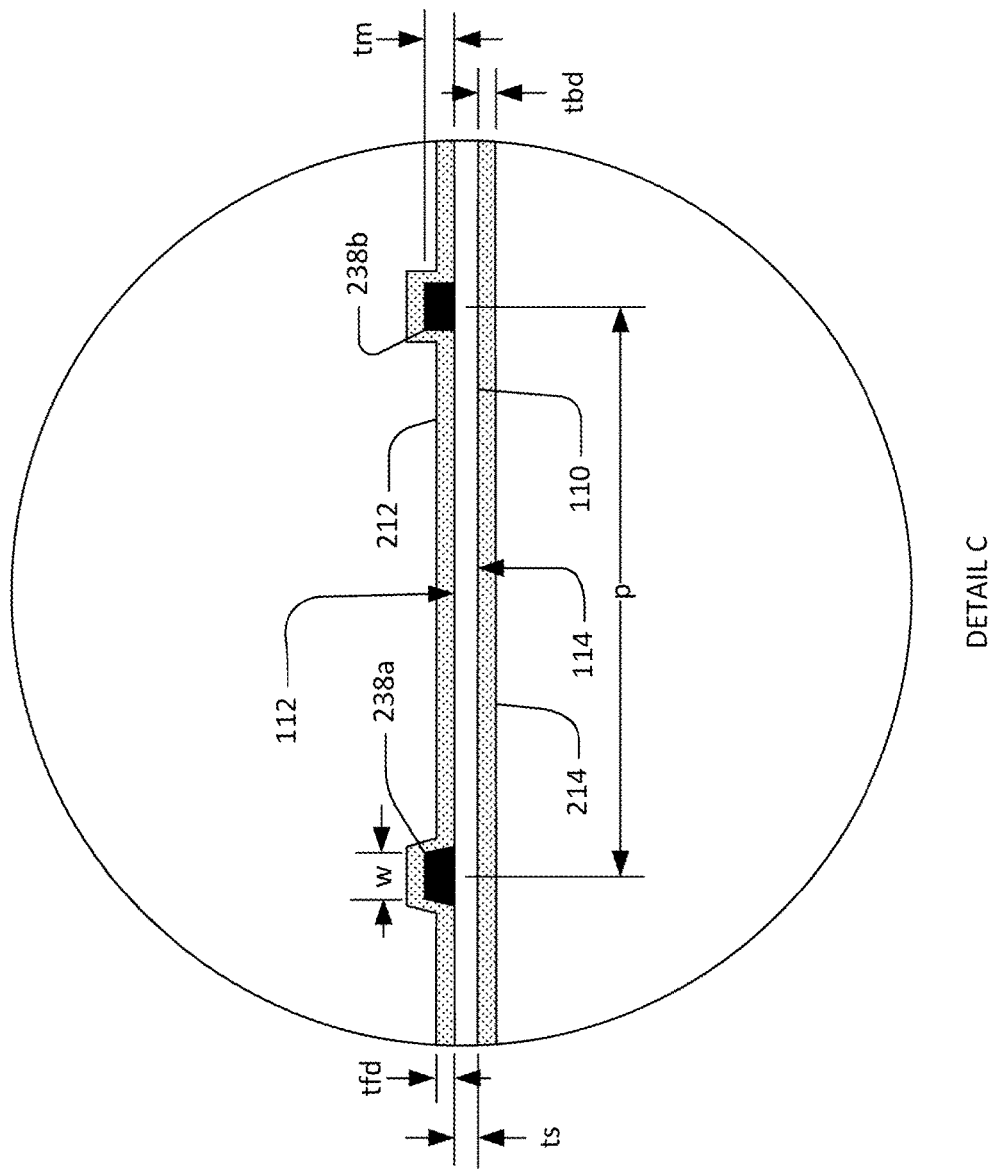
FIG. 2A is an expanded schematic cross-sectional view of a portion of the XBAR of FIG. 1.

FIG. 2A shows a detailed schematic cross-sectional view of the XBAR 100 of FIG. 1. The piezoelectric plate 110 is a single-crystal layer of piezoelectrical material having a thickness ts. Ts may be, for example, 100 nm to 1500 nm. When used in filters for 5G NR and Wi-Fi™ bands from 3.4 GHZ to 7 GHz, the thickness ts may be, for example, 150 nm to 500 nm.

A front-side dielectric layer 212 (e.g., a first dielectric coating layer or material) can be formed on the front side 112 of the piezoelectric plate 110. The "front side" of the XBAR is, by definition, the surface facing away from the substrate. The front-side dielectric layer 212 has a thickness tfd. As shown in FIG. 2A the front-side dielectric layer 212 covers the IDT fingers 238a, 238b. Although not shown in FIG. 2A, the front-side dielectric layer 212 may also be deposited only between the IDT fingers 238a, 238b. In this case, an additional thin (in comparison to tfd) dielectric layer (not shown) may be deposited over the IDT fingers to seal and passivate the fingers.

A back-side dielectric layer 214 (e.g., a second dielectric coating layer or material) can be formed on the back side 114 of the piezoelectric plate 110. In general, for purposes of this disclosure, the term "back-side" means on a side opposite the conductor pattern of the IDT structure and/or opposite the front-side dielectric layer 212. Moreover, the back-side dielectric layer 214 has a thickness tbd. The front-side and back-side dielectric layers 212, 214 may be a non-piezoelectric dielectric material, such as silicon dioxide or silicon nitride. Tfd and tbd may be, for example, 0 to 500 nm. Tfd and tbd may be less than the thickness ts of the piezoelectric plate. Tfd and tbd are not necessarily equal, and the front-side and back-side dielectric layers 212, 214 are not necessarily the same material. Either or both of the front-side and back-side dielectric layers 212, 214 may be formed of multiple layers of two or more materials according to various exemplary aspects.

The IDT fingers 238a, 238b may be aluminum, substantially aluminum alloys, copper, substantially copper alloys, beryllium, gold, some other conductive material, or any combination thereof. Thin (relative to the total thickness of the conductors, such as the IDT fingers 238a, 238b for example) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers. The cross-sectional shape of the IDT fingers may be trapezoidal (finger 238a), rectangular (finger 238b), some other shape, or any combination thereof.

Dimension p is the center-to-center spacing between adjacent IDT fingers, such as the IDT fingers 238a, 238b in FIGS. 2A, 2B, and 2C. The center-to-center spacing may be constant over the length of the IDT, in which case the dimension p may be referred to as the pitch of the IDT and/or the pitch of the XBAR. The center-to-center spacing may vary along the length of the IDT, in which case the pitch of the IDT is the average value of dimension p over the length of the IDT. Each IDT finger, such as the IDT fingers 238a, 238b in FIGS. 2A, 2B, and 2C, has a width w measured normal to the long direction of each finger. The width w may also be referred to herein as the "mark." The width of the IDT fingers may be constant over the length of the IDT, which case the dimension w is the width of each IDT finger. The width of individual IDT fingers may vary along the length of the IDT 130, in which case dimension w is the average value of the widths of the IDT fingers over the length of the IDT. Note that the pitch p and the width w of the IDT fingers are measured in a direction parallel to the length L of the IDT, as defined in FIG. 1.

The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric plate 110. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, less than, greater than, or any combination thereof, the thickness tm of the IDT fingers.

Moreover, the resonance frequency of an XBAR may be related to the total thickness of its diaphragm, including the piezoelectric plate 110, and the front-side and back-side dielectric layers 212, 214. The thickness of one or both dielectric layers may be varied to change the resonance frequencies of various XBARs in a filter. For example, shunt resonators in a ladder filter circuit may incorporate thicker dielectric layers to reduce the resonance frequencies of the shunt resonators relative to series resonators with thinner dielectric layers.

In general, the shunt resonators of a ladder filter should have a low enough resonance frequency such that each anti-resonance is approximately at the same frequency as the resonance of the series resonators. As described above, the thick coating of dielectric layer (e.g., SiO2 or SiN) that is applied over the IDT fingers reduces the resonance frequency of such shunt resonators. However, the coating over the fingers is often non-uniform (e.g., by the deposition and etching processes) in the fabricated devices due to a shadow cast by the metal electrodes of each IDT finger, which makes it difficult to control spurs in the XBAR's admittance. Thus, as will be described in detail below, an acoustic resonator device and a method for manufacturing the same is provided for applying a dielectric coating (e.g., SiO2 or SiN) on the back-side of the piezoelectric plate to provide a more uniform fabricated coating than a coating over the fingers, and therefore more accurate predictions of more control of spurs.

Referring back to FIG. 2A, the thickness tfd of the front-side dielectric layer 212 over the IDT fingers 238a, 238b may be greater than or equal to a minimum thickness required to deal and passivate the IDT fingers and other conductors on the front side 112 to the piezoelectric plate 110. The minimum thickness may be, for example, 10 nm to 50 nm depending on the material of the front-side dielectric layer and method of deposition. The thickness of the back-side dielectric layer 214 may be configured to specific thickness to adjust the resonance frequency of the resonator as will be described in more detail below.

Although FIG. 2A discloses a configuration in which IDT fingers 238a and 238b are on the top side 112 of the piezoelectric plate 110, alternative configurations can be provided. For example, FIG. 2B shows an alternative configuration in which the IDT fingers 238a, 238b are on the back side 114 of the piezoelectric plate 110 and are covered by a back-side dielectric layer 214. A front-side dielectric layer 212 may cover the front side 112 of the piezoelectric plate 110.

FIG. 2C shows an alternative configuration in which IDT fingers 238a, 238b are on the front side 112 of the piezoelectric plate 110 and are covered by a front-side dielectric layer 212. IDT fingers 238c, 238d are on the back side 114 of the piezoelectric plate 110 and are covered by a back-side dielectric layer 214. As previously described, the front-side and back-side dielectric layer 212, 214 are not necessarily the same thickness or the same material.

FIG. 2D shows another alternative configuration in which IDT fingers 238a, 238b are on the front side 112 of the piezoelectric plate 110 and are covered by a front-side dielectric layer 212. The surface of the front-side dielectric layer is planarized. The front-side dielectric layer may be planarized, for example, by polishing or some other method. A thin layer of dielectric material having a thickness tp may cover the IDT finger 238a, 238b to seal and passivate the fingers. The dimension tp may be, for example, 10 nm to 50 nm.

FIG. 3A and FIG. 3B show two alternative cross-sectional views along the section plane A-A defined in FIG. 1. In FIG. 3A, a piezoelectric plate 310 is attached to a substrate 320, which generally can correspond to substrate 120 of FIG. 1. Moreover, a cavity 340, which does not fully penetrate the substrate 320, is formed in the substrate under the portion of the piezoelectric plate 310 containing the IDT of an XBAR. The cavity 340 can correspond to cavity 120 and the piezoelectric plate 310 can correspond to piezoelectric plate 110 of FIG. 1 in an exemplary aspect. Moreover, the cavity 340 may be formed, for example, by etching the substrate 320 before attaching the piezoelectric plate 310. Alternatively, the cavity 340 may be formed by etching the substrate 320 with a selective etchant that reaches the substrate through one or more openings provided in the piezoelectric plate 310.

FIG. 3B illustrates an alternative aspect in which the substrate 320 includes a base 322 and an intermediate layer 324 that is disposed between the piezoelectric plate 310 and the base 322. For example, the base 322 may be silicon and the intermediate layer 324 may be silicon dioxide or silicon nitride or some other material, e.g., an intermediate dielectric layer. Although not shown in FIG. 3B, the substrate 320 may include more than one intermediate layer between the base 322 and the piezoelectric plate 310. As further shown, cavity 340 is formed in the intermediate layer 324 under the portion of the piezoelectric plate 310 containing the IDT fingers of an XBAR, such as the XBAR 100 of FIG. 1. The cavity 340 may be formed, for example, by etching the intermediate layer 324 before attaching the piezoelectric plate 310. Alternatively, the cavity 340 may be formed by etching the intermediate layer 324. In some cases, the etching may be performed with a selective etchant that reaches the substrate through one or more openings (not shown) provided in the piezoelectric plate 310. In this case, the diaphragm 315, which can correspond to diaphragm 115 of FIG. 1 in an exemplary aspect, may be contiguous with the rest of the piezoelectric plate 310 around a large portion of a perimeter of the cavity 340. For example, the diaphragm 315 may be contiguous with the rest of the piezoelectric plate 310 around at least 50% of the perimeter of the cavity 340. As shown in FIG. 3B, the cavity 340 extends completely through the intermediate layer 324. That is, the diaphragm 315 can have an outer edge that faces the piezoelectric plate 310 with at least 50% of the edge surface of the diaphragm 315 coupled to the edge of the piezoelectric plate 310 facing the diaphragm 315. This configuration provides for increased mechanical stability of the resonator.

In other configurations, the cavity 340 may extend into, but not though the intermediate layer 324 (i.e., the intermediate layer 324 may extend over the bottom of the cavity on top of the base 322), or may extend through the intermediate layer 324 into the base 322.

Figure 4:
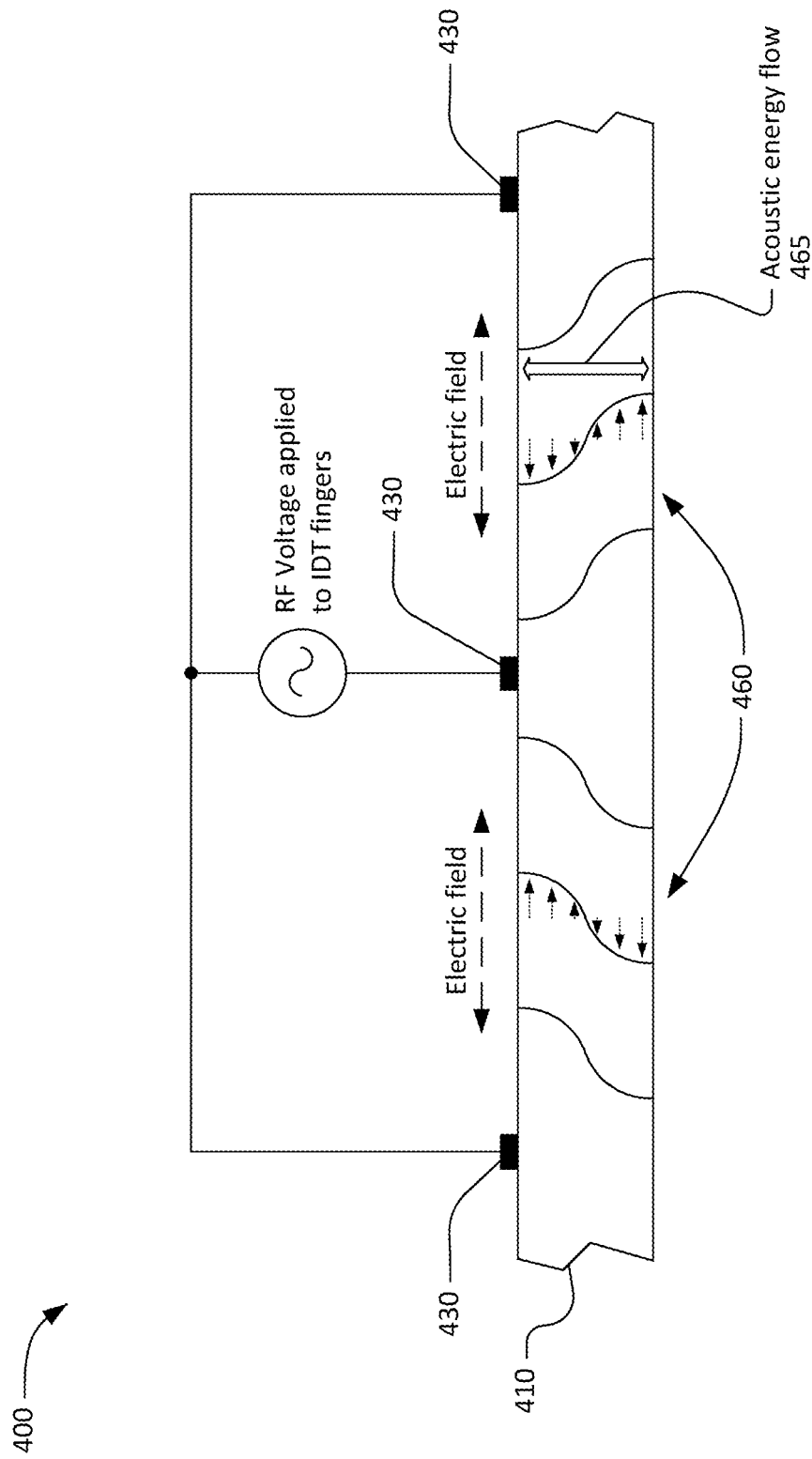
FIG. 4 is a graphic illustrating a shear horizontal acoustic mode in an XBAR resonator of FIG. 1.

FIG. 4 is a graphical illustration of the primary acoustic mode of interest in an XBAR. FIG. 4 shows a small portion of an XBAR 400 including a piezoelectric plate 410 and three interleaved IDT fingers 430. In general, the exemplary configuration of XBAR 400 can correspond to any of the configurations described above and shown in FIGS. 1, 2A to 2D, and 3A to 3B according to an exemplary aspect. Thus, it should be appreciated that piezoelectric plate 410 can correspond to piezoelectric plate 110 and IDT fingers 430 can be implemented according to any of the configurations of fingers 238a and 238b, for example.

In operation, an RF voltage is applied to the interleaved fingers 430. This voltage creates a time-varying electric field between the fingers. The direction of the electric field is lateral, or parallel to the surface of the piezoelectric plate 410, as indicated by the arrows labeled "electric field". Due to the high dielectric constant of the piezoelectric plate 410, the electric field is highly concentrated in the plate relative to the air. The lateral electric field introduces shear deformation in the piezoelectric plate 410, and thus strongly excites a shear-mode acoustic mode, in the piezoelectric plate 410. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been exaggerated for ease of visualization in FIG. 4. While the atomic motions are predominantly lateral (i.e. horizontal as shown in FIG. 4), the direction of acoustic energy flow of the excited primary shear acoustic mode is substantially orthogonal to the surface of the piezoelectric plate, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction which may be orthogonal to the direction of the electric field shown in FIG. 4. In such devices, the acoustic mode is compressive with atomic motions and the direction of acoustic energy flow in the thickness, or lateral, direction. In addition, the piezoelectric coupling for shear wave XBAR resonances can be high (>20%) compared to other acoustic resonators. Thus, high piezoelectric coupling enables the design and implementation of microwave and millimeter-wave filters with appreciable bandwidth.

Figure 5:
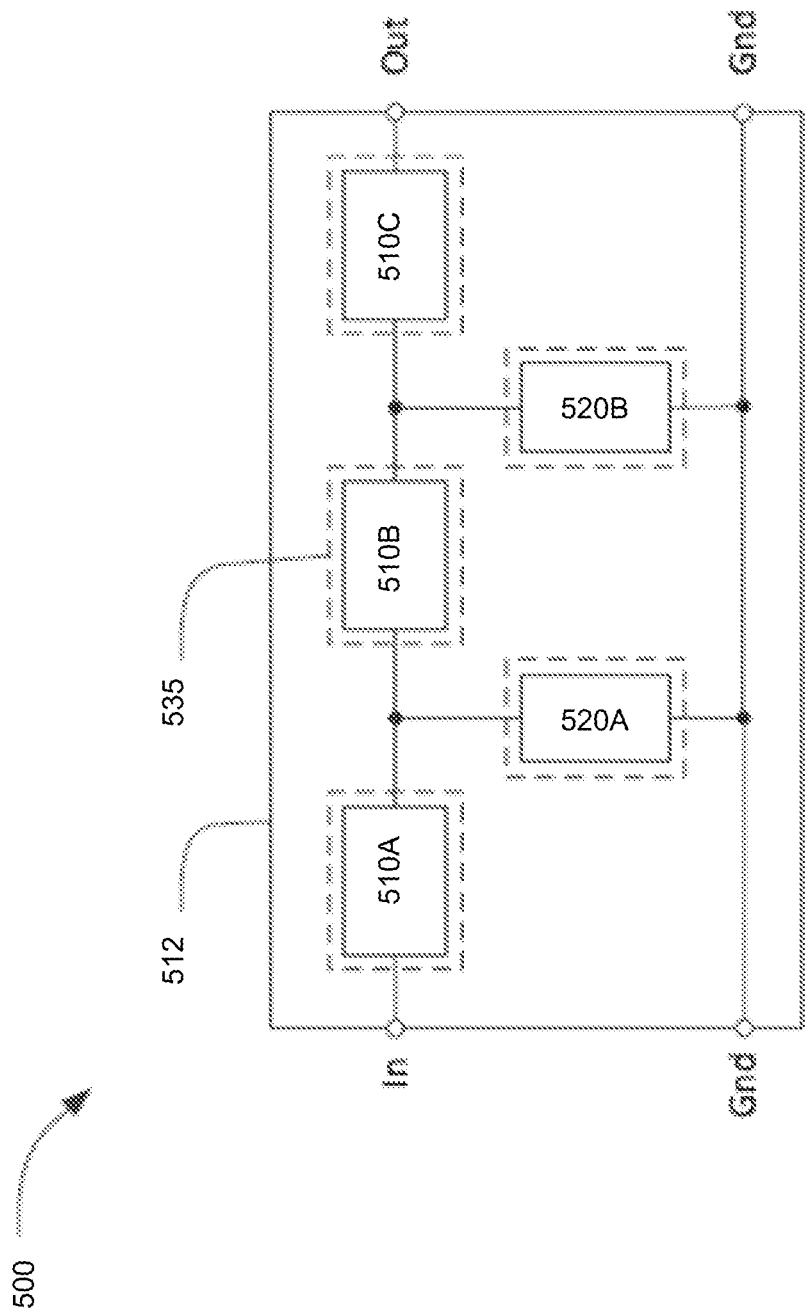
FIG. 5 is a schematic block diagram of a filter using XBAR resonators of FIG. 1.

FIG. 5 is a schematic circuit diagram and layout for a high frequency band-pass filter 500 using XBAR resonators, such as the XBAR 100 discussed above in reference to FIG. 1. The filter 500 has a ladder filter architecture including three series resonators 510A, 510B, 510C and two shunt resonators 520A, 520B. The three series resonators 510A, 510B, and 510C are connected in series between a first port and a second port. In FIG. 5, the first and second ports are labeled "In" and "Out", respectively. However, the filter 500 is bidirectional and either port and serve as the input or output of the filter. The two shunt resonators 520A, 520B are connected from nodes between the series resonators to ground. All the shunt resonators and series resonators are XBARs on a single die.

The three series resonators 510A, B, C and the two shunt resonators 520A, B of the filter 500 are formed on a single plate 512 of piezoelectric material bonded to a silicon substrate (not visible). The series and shunt resonators 510A, 510B, 510C, 520A, 520B all have a bonding layer formed on a plate of piezoelectric material. The three series resonators 510A, B, C but not the two shunt resonators 520A, B have one or more plates of piezoelectric material bonded to the bonding layer. Each resonator includes a respective IDT (not shown), such as the IDT 130 of FIG. 1, with at least the fingers of the IDT disposed over a cavity, such as the cavity 140 in the substrate 120 of FIG. 1, and at or on at least one surface of the piezoelectric material, such as the piezoelectric material 110 of FIG. 1. In this and similar contexts, the term "respective" means "relating things each to each," which is to say with at least a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity.

Figure 6:
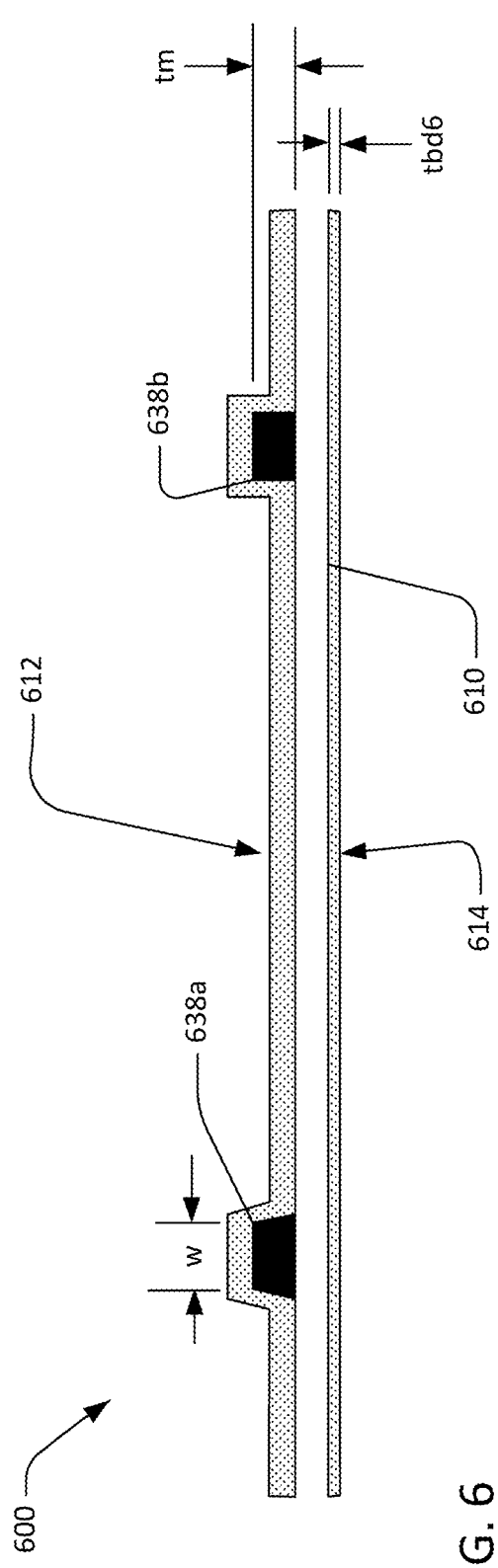
FIGS. 6 and 7 illustrate exemplary resonators 600 and 700 of the filter 500 illustrated in FIG. 5.
Figure 7:
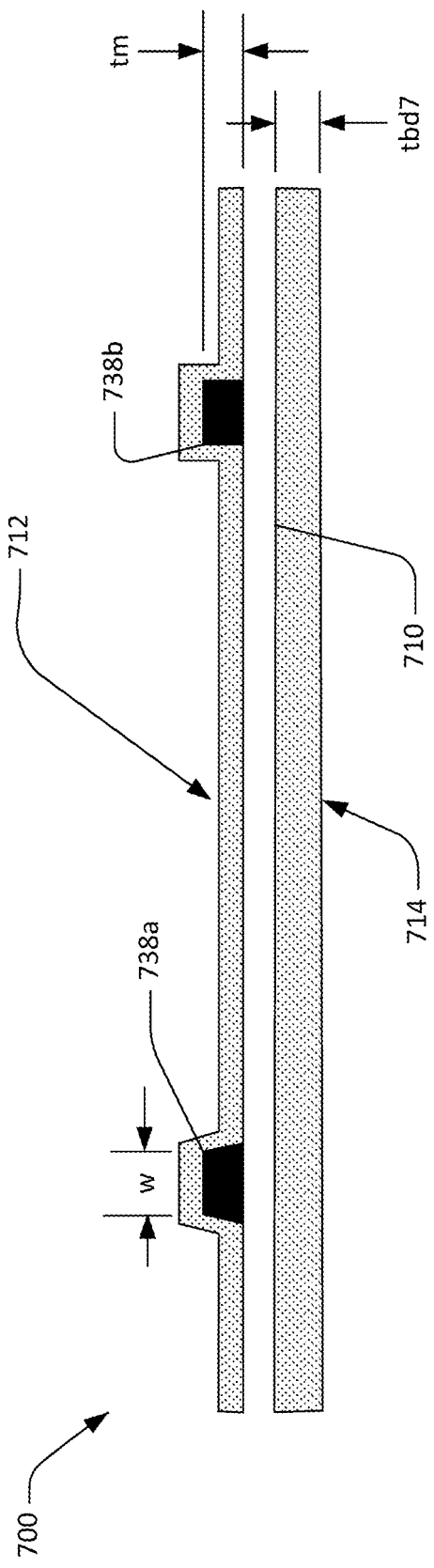

FIGS. 6 and 7 illustrate exemplary resonators 600 and 700 of the filter 500 illustrated in FIG. 5 according to an exemplary aspect. In particular, FIG. 6 illustrates a series resonator 600 that includes piezoelectric plate 610 (e.g., corresponding to piezoelectric plate 110 described above), which may be a Z-cut lithium niobate piezoelectric plate in an exemplary aspect. Moreover, a front-side dielectric layer 612 (e.g., a first dielectric coating layer or material) is formed over a first surface of the piezoelectric plate 610 and the IDT fingers 638a and 638b. It should be appreciated that the dielectric layer 612 may be conformally disposed over the IDT fingers 638a and 638b in one exemplary aspect or planarized (as described above) in an alternative aspect. Moreover, a back-side coating dielectric layer or material 614 can be disposed on the second surface of the piezoelectric plate 610 that is opposite the IDT fingers 638a and 638b. It should be appreciated that the series resonator 600 can have a configuration in which the IDT fingers 638a and 638b are disposed on a surface of the piezoelectric plate 610 facing away from the cavity (e.g., FIG. 2A) in one exemplary aspect or facing toward the cavity (e.g., FIG. 2B) in one exemplary aspect. The back-side coating dielectric layer or material 614 is on the opposite side in either case and can be trimmed to adjust the resonance of the series resonator 600.

Similarly, FIG. 7 illustrates a shunt resonator 700 that includes piezoelectric plate 710 (e.g., corresponding to piezoelectric plate 110 described above), which may also be a Z-cut lithium niobate piezoelectric plate in an exemplary aspect. Moreover, a front-side dielectric layer 712 (e.g., a first dielectric coating layer or material) is formed over a first surface of the piezoelectric plate 710 and the IDT fingers 738a and 738b. It should be appreciated that the dielectric layer 712 may be conformally disposed over the IDT fingers 738a and 738b in one exemplary aspect or planarized (as described above) in an alternative aspect.

Moreover, a back-side coating dielectric layer or material 714 can be disposed on the second surface of the piezoelectric plate 710 that is opposite the IDT fingers 738a and 738b. Similar to series resonator 600 described above, it should be appreciated that the series resonator 700 can have a configuration in which the IDT fingers 738a and 738b are disposed at a surface of the piezoelectric plate 710 facing away from the cavity (e.g., FIG. 2A) in one exemplary aspect or facing toward the cavity (e.g., FIG. 2B) in one exemplary aspect. The back-side coating dielectric layer or material 714 is on the opposite side in either case and can be trimmed to adjust the resonance of the series resonator 700.

Thus, according to an exemplary aspect, the front-side dielectric layer 712 is configured as a passivation layer for the IDT fingers 738a and 738b and can be made very thin, for example and in comparison to the back-side coating dielectric layer or material 714, to minimally cover the IDT fingers 738a and 738b, especially in a planarized configuration. As a result, the front-side dielectric layer 712 will have a thickness tm that is less than the thickness tbd7 of back-side coating dielectric layer or material 714.

According to an exemplary aspect, the configurations of the series resonator 600 and the shunt resonator 700 can be implemented to form the high frequency band-pass filter 500 described above with respect to FIG. 5. In particular, the series resonator 600 can be implemented as one or more of the series resonators 510A, B, C and the shunt resonator 700 can be implemented as one or more of shunt resonators 520A and 520B. As further shown in FIGS. 6 and 7, the back-side coating dielectric layer or material 614 of the series resonator 600 can have a first thickness tbd6 (i.e., in the thickness direction) than is less than a thickness tbd7 of the back-side coating dielectric layer or material 714 of the shunt resonator 700. As described above, applying the dielectric coating (e.g., back-side coating dielectric layers or materials 614 and 714) on the back-side of the respective piezoelectric plates provides for a more uniform fabricated coating than a coating over the fingers, and, thus, more accurate predictions of more control of spurs. Moreover, trimming the respective back-side coating dielectric layers or materials 614 and 714 to have different thicknesses allows for more fine tuning of the respective resonances of the shunt and series resonators for the filter 500. This technique provides for an accurate way of configuring the shunt resonators 520A and 520B of the ladder filter 500 to have a low enough resonance frequency such that each anti-resonance is approximately at the same frequency as the resonator of the series resonators 510A-C.

Figure 8:
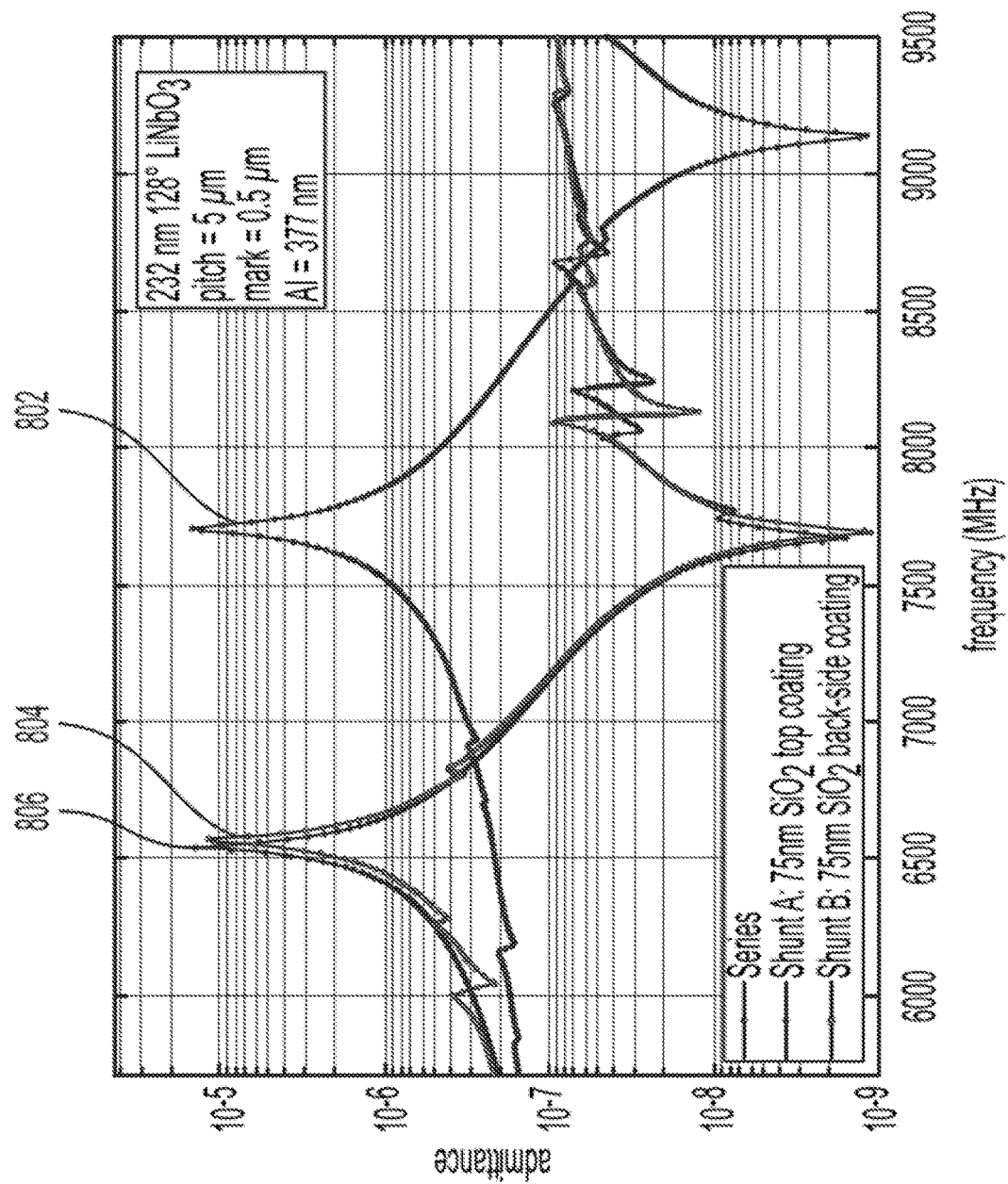
FIG. 8 is a graphical illustration of waveforms depicting a frequency response for series and shunt resonator of an exemplary ladder filter according to an exemplary aspect.

FIG. 8 is a graphical illustration of waveforms depicting a frequency response for series and shunt resonator of an exemplary ladder filter according to an exemplary aspect. In this simulation, each of the series and shunt resonators have the same piezoelectric thickness of 232 nanometers, pitch of 5 µm, mark of 0.5 µm and IDT finger thickness of 377 nanometers. The graph in FIG. 8 compares the admittances, as functions of frequency, of a series resonator 802 and two shunt resonators 804 and 806. The admittance data results from simulation of the two resonators with a 75 nm dielectric (e.g., $SiO_2$) top coating as shown in waveform 804 and a 75 nm dielectric (e.g., $SiO_2$) back-side coating as shown in waveform 806. Notably, the simulation assumes a uniform coating for the waveform 804 of the shunt resonator with the top dielectric coating, in which the admittance is very similar to the shunt resonator with back-side coating having a waveform 806.

However, as explained above, it is difficult to obtain a uniform top coating of the dielectric material over the IDT fingers due to a shadow cast by the metal electrodes, which makes it difficult to control spurs. In contrast, it is more practical an easy from a manufacturing perspective to obtain a uniform back-side coating since there are no IDT fingers. Therefore, the shunt resonator with back-side coating advantageously obtains a similar admittance 806 as the waveform 804, which is more difficult to obtain in actual manufacturing due to the shadow cast of the metal electrodes as described above.

Figure 9:
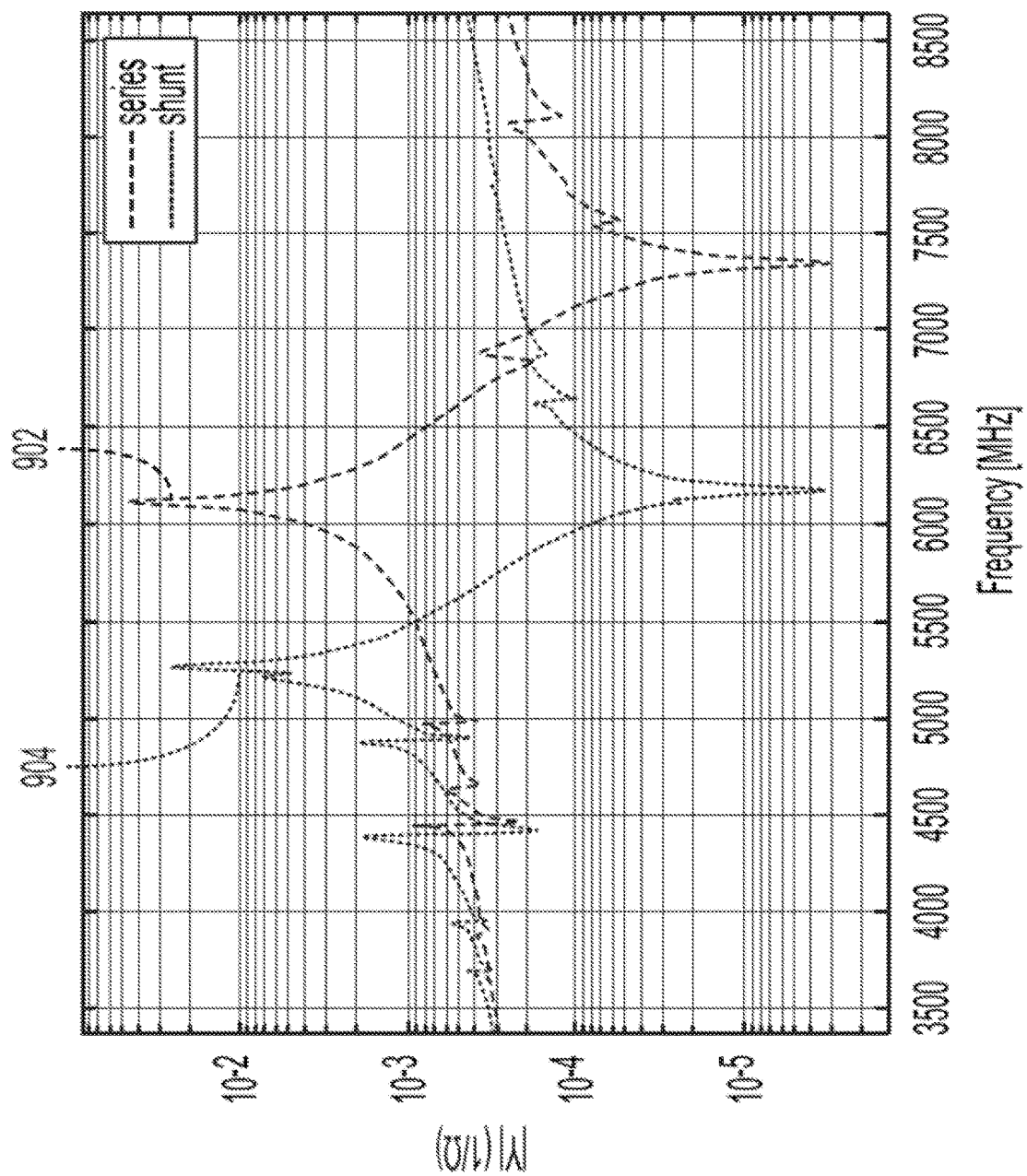
FIG. 9 is a graphical illustration of waveforms illustrating a frequency shift between the series and shunt resonator of an exemplary ladder filter according to an exemplary aspect.

FIG. 9 is a graphical illustration of waveforms illustrating a frequency shift between the series and shunt resonator of an exemplary ladder filter according to an exemplary aspect. This illustration compares a series resonator (e.g., resonator 600 of FIG. 6) and a shunt resonator (e.g., resonator 700 of FIG. 7). The simulation assumes that the respective XBARs have identical dimensions: a 274 nm 120 y LiNbO3 plate, 350 nm IDT fingers (aluminum), pitch of =4.5 µm, a mark of 1 µm, and 30 nm conformal, top-side coating of SiO2 having a thickness of 30 nm (e.g., a first dielectric coating layer or material 612 and 712, respectively). In this example, the back-side coating dielectric layer 614 of series resonator 600 has a thickness tbd6 of 10 nanometers and the back-side coating dielectric layer 714 of shunt resonator 700 has a thickness tbd7 of 100 nanometers (e.g., a thickness ratio of 1:10), which advantageously produces a desired frequency shift between the series and shunt resonators, respectively. In other words, the thickness of the second dielectric coating layer of the shunt resonator may be approximately ten times the thickness of the second dielectric coating layer of the series resonator. For purposes of this disclosure, the term "approximately" accounts for minor variations in the dimensions that may occur due to manufacturing variations, for example.

Figure 10:
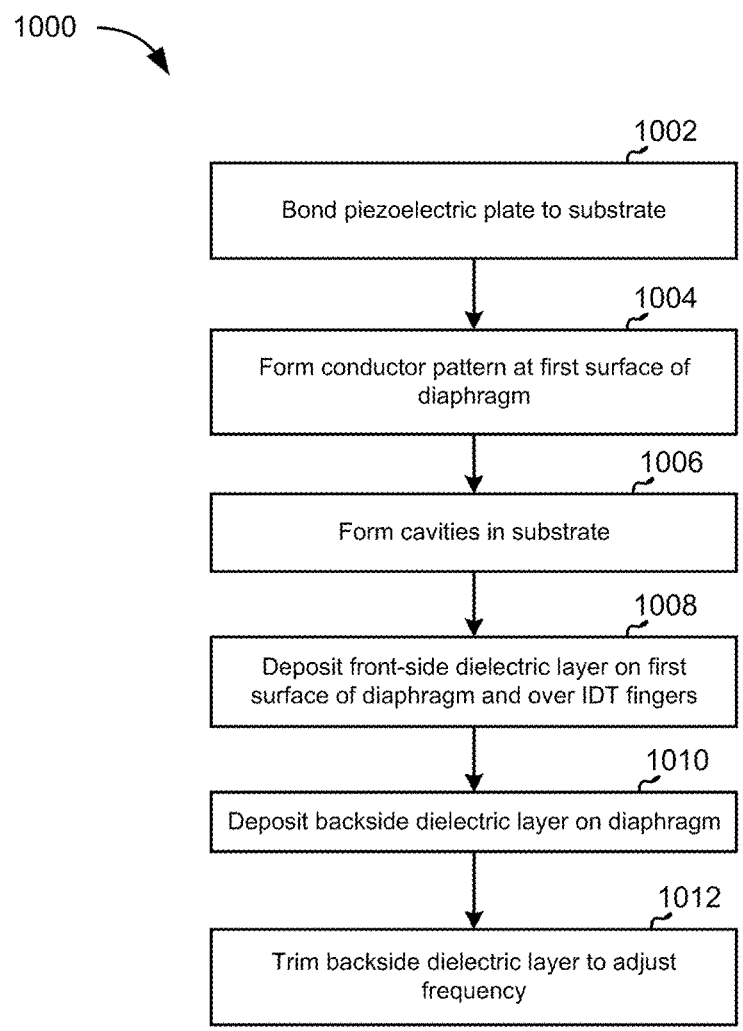
FIG. 10 illustrates a flowchart of a method of manufacturing a filter including the series and shunt resonators as described herein according to an exemplary aspect.

FIG. 10 illustrates a flowchart of a method of manufacturing an XBAR or a filter including the series and shunt resonators as described herein according to an exemplary aspect. As shown, the method 1000 starts at 1002 with a substrate and a plate of piezoelectric material and ends at 1012 with a completed XBAR or filter. The flow chart of FIG. 10 includes only major process steps for purposes of describing the exemplary manufacturing method. Various conventional process steps (e.g. surface preparation, cleaning, inspection, baking, annealing, monitoring, testing, etc.) may be performed before, between, after, and during the steps shown in FIG. 10, as would be appreciated to one skilled in the art.

The piezoelectric plate may be, for example, Z-cut lithium niobate or lithium tantalate as used in the previously presented examples, such as the piezoelectric plate 110 of FIG. 1. The piezoelectric plate may be some other material and/or some other cut. The substrate may preferably be silicon. The substrate may be some other material that allows formation of deep cavities by etching or other processing.

At 1002, the piezoelectric plate is bonded to the substrate. For a filter device, multiple piezoelectric plates may be bonded to the substrate, e.g., one for each resonator in an exemplary aspect. In any case, the piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A variation of the process 1000 is to grow the piezoelectric plate in situ on the substrate. In that process variation, bonding is not required and the action at 1002 would be redefined as "grow piezoelectric plate on substrate."

At 1004, a conductor pattern is deposited or otherwise formed at a first surface of the diaphragm of the piezoelectric plate using a metal deposition and patterning one or more conductor layer at a first surface of the piezoelectric plate. A conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1004 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques. Alternatively, the conductor pattern may be formed using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1006, one or more cavities are formed in the substrate. A separate cavity may be formed for each resonator in a filter device. The one or more cavities may be formed using an anisotropic or orientation-dependent dry or wet etch to open holes from the back side of the substrate to the piezoelectric plate. Alternatively, cavities in the form of recesses in the substrate may be formed by etching the substrate using an etchant introduced through openings in the piezoelectric plate. It should be appreciated that the cavity can be formed before the conductor pattern is formed at the piezoelectric plate in an exemplary aspect. Moreover, another variation of the process 1000 is to form the one or more cavities in the substrate prior to attaching the piezoelectric plate to the substrate. In that process variation, the actions at 1004 and 1006 occur before the action at 1002.

At 1008, a front-side dielectric layer may be formed by depositing one or more layers of dielectric material on the first surface of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

At 1010, a back-side dielectric layer may be formed. In the case where the cavities formed at 1006 are holes through the substrate, the back-side dielectric layer may be deposited through the cavities using a convention deposition technique such as sputtering, evaporation, or chemical vapor deposition. When the cavities formed at 1002 are recesses that do not fully penetrate the substrate, the back-side dielectric layer must be formed on the piezoelectric plate or the substrate prior to bonding the piezoelectric plate to the substrate. In that case, the actions at 1010 occur before the actions at 1002. In either case, the back-side dielectric layer can be uniformly deposited on the second surface (opposing the conductor pattern) of the piezoelectric plate. The back-side dielectric layer can then be trimmed at 1012 (e.g., by an etching process or the like) to adjust the resonance frequency of the respective resonator. Since the back-side dielectric coating layer is uniform, the manufacturing process can more easily control spurs in the XBAR's admittance. For purposes of this disclosure, the term "uniform" as provided a configuration for the back-side dielectric layer 614 or 714 means that the respective layer has opposing surfaces (e.g., a first surface facing and/or coupled to the piezoelectric plate and a second surface opposing this first surface) that generally extend parallel to each other and also parallel to the respective surface of the piezoelectric plate. That is, when the back-side dielectric layer is formed on the diaphragm, it is evenly distributed across the respective surface of the diaphragm, except for minor variations due to the deposition process, for example. In turn, the uniformity of the back-side dielectric layer provides for a more accurate trimming to achieve a desired resonance frequency of the respective resonator since the back-side dielectric layer can be evenly trimmed at the same rate.

In any event, after the front-side and back-side dielectric layers are formed and the back-side dielectric layer is trimmed to tune the frequency, the filter device may be completed. It should be appreciated that the back-side dielectric layers of each of the shunt and series resonators can be trimmed for a different amount of time and thus a different thickness to appropriate shift the frequency of each resonator as needed for the particular filter application. Moreover, actions that may occur to complete the filter device may include depositing and patterning additional metal layers to form conductors other than the IDT conductor pattern; depositing an encapsulation/passivation layer such as SiO2 or Si3O4 over all or a portion of the device; forming bonding pads or solder bumps or other means for making connection between the device and external circuitry; excising individual devices from a wafer containing multiple devices; other packaging steps; and testing.

The aspects described herein additionally include one or more of the following implementation examples described in the following numbered clauses.

Clause 1. A filter device, comprising: a substrate; at least one piezoelectric plate having opposing first and second surfaces and attached to the substrate; a conductor pattern at a first surface of the at least one piezoelectric plate and including a plurality of interdigital transducers (IDTs) of a plurality of resonators, respectively, that each have interleaved fingers at respective diaphragms of the at least one piezoelectric plate suspended over one or more cavities, with the plurality of resonators including a shunt resonator and a series resonator; at least one first dielectric coating layer over at least the interleaved fingers of the IDTs and on the first surface of the at least one piezoelectric plate; and at least one second dielectric coating layer on the second surface of the at least one piezoelectric plate that is opposite the first surface. Moreover, the at least one second dielectric coating layer of the shunt resonator has a greater thickness than a thickness of the at least one second dielectric coating layer of the series resonator.

Clause 2. The filter device according to clause 1, wherein the thickness of the at least one second dielectric coating layer of the shunt resonator is configured such that the shunt resonator has a resonance frequency with an anti-resonance that is approximately at a same frequency as the resonance frequency of the series resonator.

Clause 3. The filter device according to clause 1 or 2, wherein all of the plurality of IDTs are configured to excite shear acoustic waves in the at least one piezoelectric plate in response to respective radio frequency signals applied to each IDT.

Clause 4. The filter device according to any of clauses 1 to 3, wherein the one or more cavities in the substrate are respective cavities for each of the plurality of IDTs.

Clause 5. The filter device according to any of clauses 1 to 4, wherein the at least one piezoelectric plate is a Z-cut lithium niobate piezoelectric plate.

Clause 6. The filter device according to any of clauses 1 to 5, wherein the substrate comprises a base and an intermediate dielectric layer and the one or more cavities extend in the intermediate dielectric layer.

Clause 7. The filter device according to any of clauses 1 to 6, wherein the first surface of the at least one piezoelectric plate is attached to the substrate such that the conductor pattern faces the one or more cavities such.

Clause 8. The filter device according to any of clauses 1 to 7, wherein the at least one first dielectric coating layer is planarized over the interleaved fingers of the IDTs and the first surface of the at least one piezoelectric plate.

Clause 9. The filter device according to any of clauses 1 to 8, wherein the thickness of the at least one second dielectric coating layer of the shunt resonator is approximately ten times the thickness of the at least one second dielectric coating layer of the series resonator.

Clause 10. The filter device according to any of clauses 1 to 9, wherein the at least one second dielectric coating layer is uniform with opposing surfaces that are parallel to the second surface of the at least one piezoelectric plate.

Clause 11. An acoustic resonator device comprising: a substrate having a surface; a piezoelectric plate attached to the surface of the substrate except for a portion of the piezoelectric plate that forms a diaphragm that spans a cavity; an interdigital transducer (IDT) at a first surface of the piezoelectric plate and having interleaved fingers at the diaphragm; a first dielectric coating layer over at least the interleaved fingers of the IDT and on a first surface of the piezoelectric plate; and a second dielectric coating layer on a second surface of the piezoelectric plate that is opposite the first surface. In this aspect, a thickness of the second dielectric coating layer is greater than a thickness of the first dielectric coating layer. Moreover, the second dielectric coating layer is uniform with opposing surfaces that are parallel to the second surface of the piezoelectric plate that configures a resonance frequency of the acoustic resonator device.

Clause 12. The acoustic resonator device according to clause 11, wherein the IDT is configured to excite shear acoustic waves in the piezoelectric plate in response to respective radio frequency signals applied to each IDT.

Clause 13. The acoustic resonator device according to any of clauses 11 to 12, wherein the piezoelectric plate is a Z-cut lithium niobate piezoelectric plate.

Clause 14. The acoustic resonator device according to any of clauses 11 to 13, wherein the substrate comprises a base and an intermediate dielectric layer and the cavity extends in the intermediate dielectric layer.

Clause 15. The acoustic resonator device according to any of clauses 11 to 14, wherein the first surface of the piezoelectric plate is attached to the substrate such that the conductor pattern faces the cavity.

Clause 16. The acoustic resonator device according to any of clauses 11 to 15, wherein the first dielectric coating layer is planarized over the interleaved fingers of the IDT and the first surface of the piezoelectric plate.

Clause 17. A method for manufacturing a filter device, the method comprising attaching at least one piezoelectric plate having opposing first and second surfaces to a substrate; forming a conductor pattern at a first surface of the at least one piezoelectric plate that includes a plurality of interdigital transducers (IDTs) of a plurality of resonators, respectively, that each have interleaved fingers at respective diaphragms of the at least one piezoelectric plate suspended over one or more cavities, with the plurality of resonators including a shunt resonator and a series resonator; depositing at least one first dielectric coating layer over at least the interleaved fingers of the IDTs and on the first surface of the piezoelectric plate; depositing at least one second dielectric coating layer on the second surface of the piezoelectric plate that is opposite the first surface; and trimming the at least one second dielectric coating layer to adjust a resonance frequency of at least one of the shunt resonator and the series resonator.

Clause 18. The method according to clause 17, wherein the at least one second dielectric coating layer is trimmed such that the shunt resonator has a greater thickness than a thickness of the at least one second dielectric coating layer of the series resonator.

Clause 19. The method according to clause 17 or 18, wherein the thickness of the at least one second dielectric coating layer of the shunt resonator is configured such that the shunt resonator has a resonance frequency with an anti-resonance that is approximately at a same frequency as the resonance frequency of the series resonator.

Clause 20. The method according to clause 17, 18 or 19, wherein the thickness of the at least one second dielectric coating layer of the shunt resonator is approximately ten times the thickness of the at least one second dielectric coating layer of the series resonator.

In general, it is noted that throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, the pair of terms "top" and "bottom" can be interchanged with the pair "front" and "back". As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

What is claimed:

1. A filter device, comprising:
a substrate;
a piezoelectric layer having opposing first and second surfaces and attached to the substrate;
a conductor pattern on the first surface of the piezoelectric layer and including a plurality of interdigital transducers (IDTs) of a plurality of resonators, respectively, that each have interleaved fingers at respective diaphragms of the piezoelectric layer, the diaphragms being suspended over one or more cavities, and the plurality of resonators including a plurality of shunt resonators and a plurality of series resonators in a ladder filter circuit;
at least one first dielectric layer over at least the interleaved fingers of the plurality of IDTs and on the first surface of the piezoelectric layer; and
at least one second dielectric layer on the second surface of the piezoelectric layer that is opposite the first surface,
wherein the at least one second dielectric layer of all of the plurality of shunt resonators has a greater thickness than a thickness of the at least one second dielectric layer of all of the plurality of series resonators, and
wherein the at least one second dielectric layer at each of the plurality of resonators is uniform.

2. The filter device according to claim 1, wherein the thickness of the at least one second dielectric layer of at least one shunt resonator of the plurality of shunt resonators is configured such that the at least one shunt resonator has a resonance frequency with an anti-resonance that is approximately at a same frequency as the resonance frequency of at least one series resonator of the plurality of series resonators.

3. The filter device according to claim 1, wherein all of the plurality of IDTs are configured to excite shear acoustic waves in the respective diaphragms of the piezoelectric layer in response to respective radio frequency signals applied to each IDT of the plurality of IDTs.

4. The filter device according to claim 1, wherein the one or more cavities are in the substrate and are respective cavities for each of the plurality of resonators.

5. The filter device according to claim 1, wherein the at least one second dielectric layer is thicker than the at least one first dielectric layer for each of the plurality of shunt or series resonators.

6. The filter device according to claim 1, wherein the substrate comprises a base and an intermediate dielectric layer and the one or more cavities extend in the intermediate dielectric layer.

7. The filter device according to claim 1, wherein the first surface of the piezoelectric layer is attached to the substrate such that the conductor pattern faces the one or more cavities.

8. The filter device according to claim 1, wherein the at least one first dielectric layer is planarized over the interleaved fingers of the plurality of IDTs and the first surface of the piezoelectric layer.

9. The filter device according to claim 1, wherein the thickness of the at least one second dielectric layer of at least one shunt resonator of the plurality of shunt resonators is approximately ten times the thickness of the at least one second dielectric layer of at least one series resonator of the plurality of series resonators.

10. The filter device according to claim 1, wherein the at least one second dielectric layer is uniform with opposing surfaces that are parallel to the second surface of the piezoelectric layer.

11. The filter device according to claim 10, wherein the at least one second dielectric layer is uniform with opposing surfaces that are parallel in that the opposing surfaces generally extend parallel to each other.

12. The filter device according to claim 1, wherein the first dielectric layer of at least one resonator of the plurality of resonators is conformally disposed over the interleaved fingers of the at least one resonator.

13. The filter device according to claim 1, wherein, when a voltage is applied to the plurality of IDTs, an electric field is excited that is lateral within the piezoelectric layer introducing shear deformation of a bulk acoustic wave, and wherein the bulk acoustic wave propagates orthogonal to a direction of the electric field.

14. A bulk acoustic resonator filter comprising:
a series laterally-excited bulk acoustic resonator comprising:
   a substrate having a base and an intermediate layer;
   a piezoelectric layer attached to the intermediate layer, and a portion of the piezoelectric layer disposed over a cavity of the series laterally-excited bulk acoustic resonator;
   an interdigital transducer (IDT) comprising interleaved fingers disposed on the piezoelectric layer;
   a first dielectric layer on a first surface of the piezoelectric layer between the interleaved fingers; and
   a second dielectric layer on a second surface of the piezoelectric layer that is opposite the first surface,
   wherein a thickness of the second dielectric layer is greater than a thickness of the first dielectric layer;
a shunt laterally-excited bulk acoustic resonator comprising:
   a substrate having a base and an intermediate layer;
   a piezoelectric layer attached to the intermediate layer, and a portion of the piezoelectric layer disposed over a cavity of the shunt laterally-excited bulk acoustic resonator;
   an IDT comprising interleaved fingers disposed on the piezoelectric layer;
   a first dielectric layer on a first surface of the piezoelectric layer between the interleaved fingers; and
   a second dielectric layer on a second surface of the piezoelectric layer that is opposite the first surface,
   wherein a thickness of the second dielectric layer is greater than a thickness of the first dielectric layer,
wherein the second dielectric layer of the shunt laterally-excited bulk acoustic resonator has a greater thickness than a thickness of the second dielectric layer of the series laterally-excited bulk acoustic resonator,
wherein the second dielectric layer of the series laterally-excited bulk acoustic resonator is uniform, and
wherein the second dielectric layer of the shunt laterally-excited bulk acoustic resonator is uniform.

15. The bulk acoustic resonator filter according to claim 14, wherein, for the series and shunt laterally-excited bulk acoustic resonators, respective IDTs are disposed on the respective piezoelectric layers, such that the respective IDTs faces the respective cavity.

16. The bulk acoustic resonator filter according to claim 14, wherein the first dielectric layer is planarized over the interleaved fingers of the IDT and the piezoelectric layer of each of the series and shunt laterally-excited bulk acoustic resonators.

17. The bulk acoustic resonator filter according to claim 14, wherein the thickness of the second dielectric layer of the shunt laterally-excited bulk acoustic resonator has a resonance frequency with an anti-resonance that is approximately at a same frequency as a resonance frequency of the series laterally-excited bulk acoustic resonator.

18. The bulk acoustic resonator filter according to claim 14, wherein the bulk acoustic resonator filter comprises a ladder filter circuit, wherein the series laterally-excited bulk acoustic resonator is one of a plurality of series laterally-excited bulk acoustic resonators, the shunt laterally-excited bulk acoustic resonator is one of a plurality of shunt laterally-excited bulk acoustic resonators, and wherein the second dielectric layer of any of the shunt laterally-excited bulk acoustic resonators is thicker than any of the first dielectric layers of any of the series laterally-excited bulk acoustic resonators.

19. The bulk acoustic resonator filter according to claim 14, wherein, when a voltage is applied to the IDTs of each of the series and shunt laterally-excited bulk acoustic resonators, an electric field is excited that is lateral within the respective piezoelectric layer introducing lateral deformation of a bulk acoustic wave, and wherein the bulk acoustic wave propagates orthogonal to a direction of the electric field.

20. The bulk acoustic resonator filter according to claim 14, wherein the first dielectric layer of at least one of series laterally-excited bulk acoustic resonators and the shunt laterally-excited bulk acoustic resonators is conformally disposed over the interleaved fingers.

* * * * *